United States Patent
Helvajian

(10) Patent No.: US 8,940,241 B2
(45) Date of Patent: Jan. 27, 2015

(54) PHOTOSTRUCTURED CHEMICAL DEVICES AND METHODS FOR MAKING SAME

(75) Inventor: Henry Helvajian, Pasadena, CA (US)

(73) Assignee: The Aerospace Corporation, El Segundo, CA (US)

( * ) Notice: Subject to any disclaimer, the term of this patent is extended or adjusted under 35 U.S.C. 154(b) by 351 days.

(21) Appl. No.: 12/686,972

(22) Filed: Jan. 13, 2010

(65) Prior Publication Data
US 2011/0171068 A1    Jul. 14, 2011

(51) Int. Cl.
| C06B 21/00 | (2006.01) |
| B01J 19/00 | (2006.01) |
| B01L 3/00 | (2006.01) |
| B81C 1/00 | (2006.01) |

(52) U.S. Cl.
CPC .............. B01J 19/0093 (2013.01); *C06B 21/00* (2013.01); *B01J 2219/00788* (2013.01); *B01J 2219/00835* (2013.01); B01L 3/502707 (2013.01); *B01L 3/50273* (2013.01); *B01L 3/502738* (2013.01); *B01L 2300/0654* (2013.01); *B01L 2300/0874* (2013.01); *B01L 2300/12* (2013.01); *B01L 2400/0439* (2013.01); *B01L 2400/0478* (2013.01); *B01L 2400/0633* (2013.01); *B81B 2201/051* (2013.01); *B81B 2203/0338* (2013.01); B81C 1/00634 (2013.01)
USPC ........................................................ 422/163

(58) Field of Classification Search
CPC . B01J 19/08; B29C 35/08; B41J 2002/14491; B01L 3/5027
USPC ......................................................... 422/163
See application file for complete search history.

(56) References Cited

U.S. PATENT DOCUMENTS

| 3,620,965 | A | * | 11/1971 | Rosinski ................... 208/120.01 |
| 5,272,240 | A | | 12/1993 | Haruvy et al. |
| 5,941,501 | A | | 8/1999 | Biegelsen et al. |
| 5,961,932 | A | | 10/1999 | Ghosh et al. |
| 6,055,899 | A | | 5/2000 | Feit et al. |
| 6,129,002 | A | | 10/2000 | Lisec et al. |
| 6,283,440 | B1 | | 9/2001 | Evans |
| 6,717,227 | B2 | | 4/2004 | Tamura et al. |
| 6,796,148 | B1 | | 9/2004 | Borrelli et al. |
| 6,932,933 | B2 | | 8/2005 | Helvajian et al. |

(Continued)

FOREIGN PATENT DOCUMENTS

| DE | 10225720 | 2/2004 |
| EP | 1541991 A1 | 6/2005 |
| EP | 1123739 A1 | 11/2006 |

OTHER PUBLICATIONS

International Search Report dated Jun. 12, 2011 for International Application No. PCT/US11/88235.

(Continued)

*Primary Examiner* — Lore Jarrett
(74) *Attorney, Agent, or Firm* — Sutherland, Asbill & Brennan LLP

(57) ABSTRACT

A photostructurable ceramic is processed using photostructuring process steps for embedding devices within a photostructurable ceramic volume, the devices may include one or more of chemical, mechanical, electronic, electromagnetic, optical, and acoustic devices, all made in part by creating device material within the ceramic or by disposing a device material through surface ports of the ceramic volume, with the devices being interconnected using internal connections and surface interfaces.

11 Claims, 5 Drawing Sheets

(56) References Cited

U.S. PATENT DOCUMENTS

| | | |
|---|---|---|
| 6,952,530 B2 | 10/2005 | Helvajian et al. |
| 7,059,339 B2 | 6/2006 | Delapierre |
| 7,534,402 B2 | 5/2009 | Morse et al. |
| 7,689,070 B2 | 3/2010 | Ouchi |
| 8,096,147 B2 | 1/2012 | Flemming et al. |
| 8,369,070 B2 | 2/2013 | Helvajian et al. |
| 8,410,660 B2 | 4/2013 | Helvajian et al. |
| 8,479,375 B2 | 7/2013 | Helvajian |
| 2001/0024820 A1* | 9/2001 | Mastromatteo et al. ... 435/287.2 |
| 2002/0139769 A1* | 10/2002 | Helvajian et al. ............... 216/18 |
| 2003/0013046 A1* | 1/2003 | Fonash et al. ................. 430/314 |
| 2003/0063889 A1 | 4/2003 | Lavallee et al. |
| 2003/0064275 A1 | 4/2003 | Morse et al. |
| 2003/0194369 A1* | 10/2003 | Prasad et al. ............... 423/658.2 |
| 2004/0137372 A1 | 7/2004 | Livingston et al. |
| 2005/0009101 A1 | 1/2005 | Blackburn |
| 2005/0031490 A1 | 2/2005 | Gumbrecht et al. |
| 2005/0176037 A1* | 8/2005 | Mastromatteo et al. .......... 435/6 |
| 2006/0011278 A1* | 1/2006 | Rezaie et al. .................... 149/92 |
| 2006/0144706 A1 | 7/2006 | Adourian et al. |
| 2008/0248250 A1 | 10/2008 | Flemming et al. |
| 2008/0283944 A1 | 11/2008 | Geefay |
| 2009/0001019 A1* | 1/2009 | Frometa et al. ............... 210/637 |
| 2009/0288820 A1* | 11/2009 | Barron et al. ................. 166/249 |
| 2010/0084626 A1 | 4/2010 | Delhougne et al. |
| 2010/0157568 A1 | 6/2010 | Ewe et al. |
| 2010/0304306 A1 | 12/2010 | Blanco Barro et al. |
| 2011/0167941 A1 | 7/2011 | Helvajian |
| 2011/0170210 A1 | 7/2011 | Helvajian |
| 2012/0025414 A1 | 2/2012 | Schmidt et al. |
| 2012/0107597 A1 | 5/2012 | Kim et al. |
| 2012/0126458 A1 | 5/2012 | King et al. |
| 2012/0153239 A1 | 6/2012 | Chandrasekhar et al. |
| 2013/0168901 A1 | 7/2013 | Helvajian et al. |
| 2013/0265730 A1 | 10/2013 | Helvajian et al. |

OTHER PUBLICATIONS

Written Opinion of the International Searching Authority dated Jul. 13, 2012 for International Application No. PCT/US11/88235.
International Search Report dated Apr. 3, 2012 for International Application No. PCT/US11/88217.
Written Opinion of the International Searching Authority dated Jul. 13, 2012 for International Application No. PCT/US11/88217.

* cited by examiner

PHOTOSTRUCTURED CHEMICAL DEVICES AND METHODS FOR MAKING SAME

REFERENCE TO RELATED APPLICATIONS

The present application is related to the following co-pending applications: "Photostructured Mechanical Devices and Methods for Making Same," application Ser. No. 12/686,976, filed Jan. 13, 2010; "Photostructured Electronic Devices and Methods for Making Same," application Ser. No. 12/686,978, filed Jan. 13, 2010; "Photostructured Magnetic Devices and Methods for Making Same," application Ser. No. 12/686,984, filed Jan. 13, 2010; "Photostructured Optical Devices and Methods for Making Same," application Ser. No. 12/686,986, filed Jan. 13, 2010; and "Photostructured Acoustic Devices and Methods for Making Same," application Ser. No. 12/686,989, filed Jan. 13, 2010. The entirety of each aforementioned application is hereby incorporated by reference.

FIELD OF THE INVENTION

This invention generally relates to the fields of photostructurable ceramics. More particularly, the inventions relate to devices disposed in photostructurable ceramic volumes and methods for making the same.

BACKGROUND OF THE INVENTION

Microelectronics and microelectromechanical systems (MEMS) development has demonstrated that the miniaturization of complex instruments and devices is feasible when subsystems can be miniaturized and integrated on a common platform. This miniaturization and integration have opened various markets, such as a worldwide market in telecommunications to provide instant and direct information to the user of a hand held device. This growing MEMS industry is evolving to further integrate devices, such as photonic devices onto a common platform. The insertion of photonic devices, for example, has at least two advantages. First, miniaturized components provide for an increase in the data transfer bandwidth. Second, the insertion of photonic devices enables the development of a variety of miniature analytical instrumentation that utilize optical spectroscopy for precision sensing such as that used in biological assay and chemical applications. The miniature analytical instrument application area, also called micro total analysis systems (µ-TAS), is perceived to be a growing industry. In any integrated instrument, the intelligence and memory are aptly handled by microelectronics fabrication technology. If the instrument requires sensing or control, then MEMS technology has been shown to be successful.

Many miniaturized devices can be developed using MEMS fabrication technologies for making small structures and devices, such as electromagnetic antennas, electronic capacitors, chemical reactors, mechanical motors, optical filters, and acoustic sensors, among a vast array of possible devices. The further integration of these devices onto a common platform requires an ability to make three-dimensional interconnections among these devices or a mix of devices. The existing approaches to fabricating electrical conducting structures are confined to structures in two dimensions. In so doing, two-dimensional pattern metallization processing technology can be used, such as microelectronics lithography. However, some devices do not work as well in two dimensions, such as high frequency antennas and transformers. So, the MEMS industry circumvents these limitations imposed by the two-dimensional metallization by stacking a sequence of two-dimensional electrically conducting patterns on insulating material and electrically connecting the stacks with patterned vertical vias. This assembly is not a true three-dimensional structure. However, the repetitive two-dimensional approach works well for laying out multilevel conducting lines, but has limitations when more complex three-dimensional electrical conducting structures are to be fashioned, such as with coils, inductors, and horn antennas where curvature is used to enhance efficiency. In the cases where complex high aspect ratio microelectrical structures are to be constructed, there are processing techniques for patterning metallization in true three dimensions.

In these three-dimensional processing approaches, the designed structures may have micrometer features or lengths that are in the submillimeter scale so as to require careful handling after release. To circumvent failure as a result of handling, there are device encapsulation and packaging techniques to electrically insulate and protect these small delicate structures. However, most of the processing approaches use a conformal spray or coating approach. These approaches may risk destroying the fragile device as a result of surface tension forces during the drying phase, such as with induced stresses. If the device survives the drying phase, the device is then susceptible to damage during the instrument development phase when the structure or device must be inserted or placed onto the platform by an automated pick and place machine. The potential for damage is also present when these fragile small devices are connected, such as by wire bonding and soldering, to an adjoining electrical unit using an electrical interface.

Photostructurable glass ceramic materials are used to make internal structures having internal functional surfaces defined during a photostructuring process. An entire volume is made of photostructurable material. For example, U.S. Pat. No. 6,783,920, by Livingston et al., entitled Photosensitive Glass Variable Laser Exposure Patterning Method, issued Aug. 31, 2004; U.S. Pat. No. 6,932,933, by Helvajian et al., entitled Ultraviolet Method of Embedding Structures in Photocerams; and U.S. Pat. No. 6,952,530, by Helvajian et al., entitled Integrated Glass Ceramic Systems, issued Oct. 4, 2005 teach the processing of photostructurable materials for making structures within a photostructurable volume. U.S. Pat. No. 6,830,221, by Janson et al., entitled Integrated Glass Ceramic Spacecraft, issued Dec. 14, 2004, teaches the encapsulation of the various devices within a glass ceramic volume which consists of several separate glass housing parts. However, a problem with such encapsulation is a required number of housing components integrated as a singular housing. These patents generally teach embedding photostructurable structures within a ceramic volume where the structures and volumes are all made of the photostructurable material. The encapsulation problem is similar to plastic injection machines where the two halves of a mold are pressed together, and hot plastic is injected through an injection port and conduit runners to cavities defining a desired plastic part.

The photostructurable glass ceramics are a class of materials that may be patterned in two dimensions by masks and lithography or in three dimensions by laser direct-write processing patterning. The patterning process may entail the site selective photo exposure of the material after which the material may undergo a baking step to realize the exposure effects. With a certain bake protocol, there is the in-situ growth of a crystalline phase in the exposed regions. For a specific protocol, the crystalline material is found to be etchable in dilute hydrofluoric acid, while for another bake protocol, it is not etchable. The etchable crystalline phase can be etched in excess of 30-50 times faster than the unexposed material and thereby allows for patterned structures to have aspect ratios that can exceed 50:1.

The prior photostructurable manufacturing processes do not provide a processing approach by which delicate structures and devices can be disposed in the volume for enabling functional interconnections fashioned within a protective volume. These and other disadvantages may be solved or reduced using the invention.

SUMMARY OF THE INVENTION

The invention includes a fabrication process that uses process steps to form internal structures within a photostructurable volume and process steps to create device material within the volume resulting in an integrated device including an embedded device within the photostructurable volume. The internal structures can be created by forming plumbing within the volume using the photostructurable processes. The plumbing includes any internal or surface empty processed volumes that can be made through photostructuring. The plumbing can be enhanced by acid treatments. The plumbing includes cavities, vias, tanks, voids, gaps, wells, bubbles, tubes, spheres, tunnels, plates, coils, feedthroughs, guides, and apertures, among many other possible structures. Note that the plumbing is not necessarily a construct that includes a void.

The device material may be created within the volume in two primary ways. The volume has on its surface a port or an interface through which a device material is communicated for depositing the device material into the plumbing. The ports and interfaces may be used for an external operable interface connection. The device material may be deposited by pressure insertion into the plumbing. The insertion method may vary. For example, the insertion of the device material may be by extrusion, or, for another example, by liquid hydraulic action through a surface port. The device material may also be created within the plumbing by exposure processing of a plumbing portion for in situ transformation of the photostructurable material into the device material. Hence, in one aspect, the device material may be created by insertion and in the other aspect, the device material may be created by the transformation of a selective material volume in situ, but with the device material having operative characteristics beyond the material property of the surrounding ceramic photostructurable volume. For example, to create the device material by insertion, an electronically conducting liquid polymer, such as polypyrole or polyaniline, is applied by liquid hydraulic action through a surface port into a plumbing cavity. In another aspect, direct selective in situ precipitation of a conducting crystalline phase of the photostructurable material within the glass and ceramic material creates an in situ conductor. Thus, two approaches may be used to pattern elements and devices within a ceramic volume thereby enabling the fabrication of complete subsystems in solitary form or in integrated arrays that are naturally encapsulated within the insulating volume. Both insertion and exposure internal transformation processing approaches are amenable to the use of mass production tooling, such as injection molding, and laser direct-write processing that addresses the need for miniaturized and protected systems that require interfacing, but yet are amenable to manipulation by automated pick and place machines.

The methods enable the three-dimensional fabrication of complex components that are sealed within a ceramic material. Advantageously, while the structures and the three-dimensional interconnects are delicately fashioned with aspect ratios that can exceed 50:1, these fragile integrated units are contained in a block of electrically insulating glass or ceramic material that can have the shape of a die or have the convenient dimensions of a chip carrier package. The volume becomes the package, which not only insulates the embedded devices or structures, but also allows for ease of handling without causing damage to small devices.

The method allows for the design and true three-dimensional fabrication of structures that could have feature sizes down to 50 microns or less (for some commercially made photostructural glasses or ceramics) and an overall size scaling to square meters or larger. Furthermore, the invention also allows the possibility for fabricating stacked arrays of electrically conducting microstructures for microinstrument applications. Regardless of the specific nature of the device fabricated, the resulting part is encapsulated in a glass or ceramic medium volume that is resistant to the natural environment, to many caustic chemicals, and can operate at elevated temperatures. These and other advantages will become more apparent from the following detailed description.

DETAILED DESCRIPTION OF THE INVENTION

Figure 1:
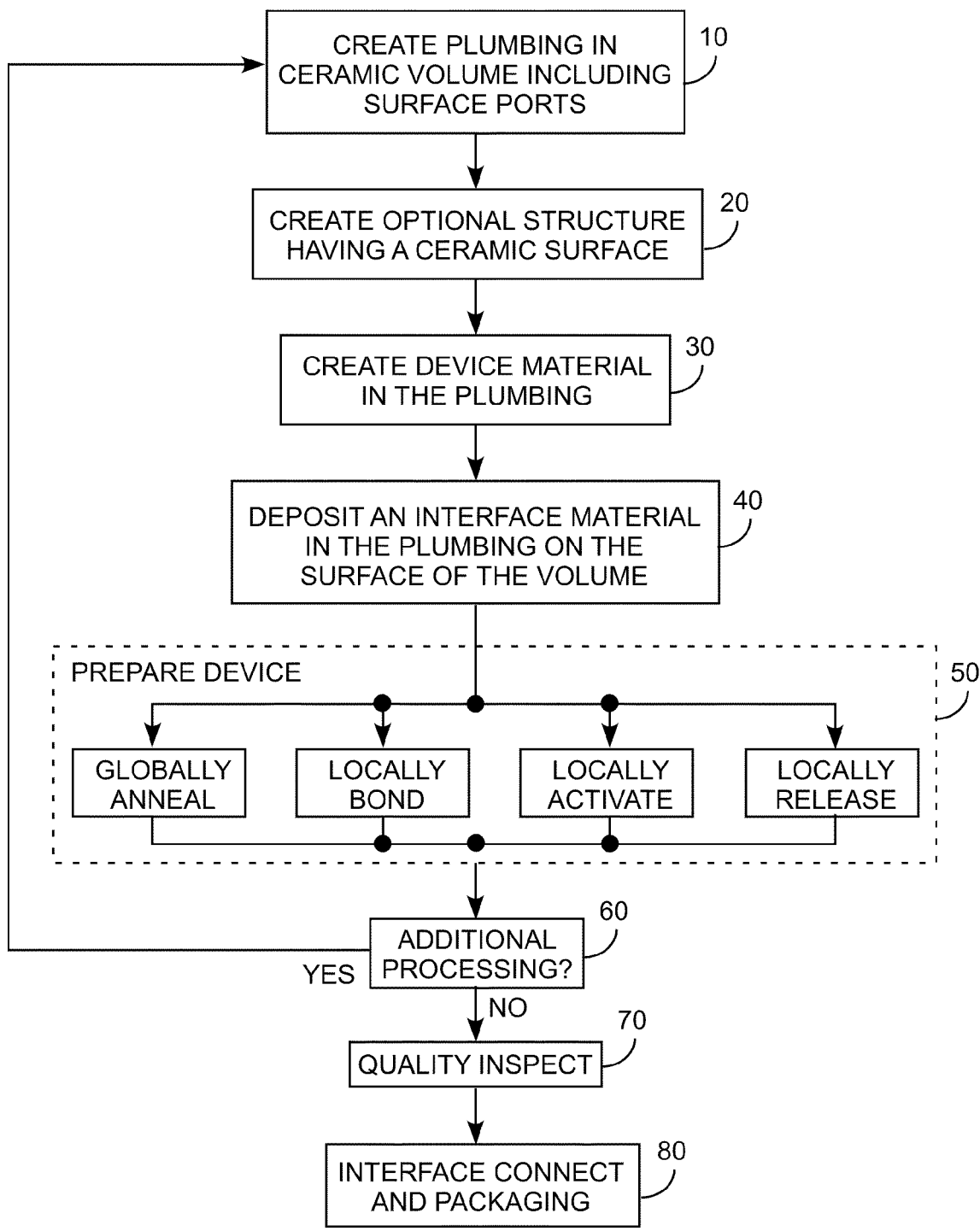
FIG. 1 is a flow diagram of various process steps used to embed a device in a photostructurable ceramic volume, in accordance with an example embodiment of the invention.

An embodiment of the invention is described with reference to the figures using reference designations as shown in the figures. Referring to FIG. 1, block 10, a three dimensional (3D) volume of photostructurable glass or ceramic material is first processed by laser exposure to define plumbing within the 3D volume. The plumbing can take any desired cavity shape and can be oriented in any direction, such as in vias, tanks, voids, gaps, spheres, tunnels, bubbles, tubes, conduits, plates, coils, feedthroughs, guides, and apertures, among many other possible vacated structures.

The plumbing can include vacated portions that do not function as mere conduits, but as optional cavities performing a desired function, as described in block 70. For example, a tank can be used as an operational receptacle for any operational device material during operational use. The volumes can be processed for creating internal empty volumes that then become internal operational structures, such as a surface grating (e.g., optical or mechanical).

The plumbing can remain as structured and patterned voids or it may contain a device material, as described in block 30. Furthermore, portions of the plumbing can be filled with a device material disposed in an operational empty cavity. After the plumbing is defined by laser exposure and chemical etch processing for creating voids, device material is disposed into the empty volumes of the plumbing. The deposition of the device material may be done by inserting the device material from outside of the volume to inside of the volume and into the plumbing. The device material can be inserted into the plumbing. An alternative way of creating the device material in the volume is to process a portion of the plumbing volume so as to change the material characteristic of the processed ceramic in the volume plumbed. As such, the device material can be inserted material or the device material can be processed material made from selected processing of the ceramic material. The device material can be made in situ by selected enhanced processing of a portion of the ceramic material. In either case, a device material is created in the volume defined by the plumbing.

After the device material is created in the volume, a preferred interface may be created, as described in block 40. The interface is typically a structure that connects the volume to the surfaces. The interface can be a bonding pad, for example, where the plumbing at the surface is in the form of a void pad that is then filled with an interfacial inserted material, such as gold, for making a gold bonding pad for an electrical connection to an internal device made from internal inserted material or processed material.

The device can be prepared using additional preparation steps as desired, as described in block 50. These additional preparation steps may include, for example, globally annealing the volume, locally bonding the device material, locally activating the device material, and locally releasing the device material. Annealing is typically used to strengthen the volume and the device material or to smooth internal cavity surfaces if they exist. Bonding is typically used to interconnect the volume and material to the outside external devices such as generators and detectors. Local activation is typically used to activate a material for operational use, such as by chemical, optical or magnetic treatment. Releasing is typically used to free a portion of the device material when used as part of a mechanical device having a free moving internal part. The device can be processed several times and in a various order of steps. For example, a first plumbing cavity is made and then is filled with a first inserted material, and then, a second plumbing cavity is made and then filled with a second inserted material. In this manner, complex devices can be made within the volume using various materials in respective, iterative process steps. After the volume is completely fabricated at block 60, the volume can be cleaned, inspected (at block 70), interfacially connected, and packaged (block 80), which may require for example, bonding the volume to a package, such as a dual in-line package.

The desired patterned volume may be converted to have electrical conduction properties in exposed plumbing in the volume either by mask and UV lithography for two-dimensional (2D) processing or via UV laser direct-write pattern processing technology in 3D. The embedded plumbing can be patterned by controlling pulsed UV laser power within the focused exposure volume to allow exposure only within a voxel (e.g., a volume element) and not elsewhere.

The inserted material can be conductive. When a high degree of electrical conduction with low resistivity is required, then in addition to the embedded plumbing pattern, additional via holes may be patterned to allow the embedded plumbing to come in contact with and be processed by a chemical etchant. The exposed pattern is baked to produce an etchable crystalline phase in the exposed regions. The volume is chemically etched in dilute hydrofluoric acid, which results in the fabrication of plumbing cavities in the desired 2D or 3D patterns. These embedded cavities are connected to the surface through the chemical etched paths in the plumbing. The plumbing of embedded cavities is then filled with a conducting material that either has electrical conductivity or can be converted to have electrical conductivity using a treatment process. In the former case, a conducting paste at the right viscosity for the patterned channel widths can be used along with extrusion manufacturing tooling and processes. The paste is forced into the channels by applied pressure typically through hydraulic action. In the case of a paste, the manufacturing process ends with a global annealing low temperature bake at 100° C. that cures conducting paste. In the latter case, a photosensitized conducting polymer, such as a polyaniline with dopants, is forced into all the cavities. UV light is applied to induce polymerization either through direct-write patterning or through flood exposure followed also by a low temperature bake.

Electromagnetic devices can be made for use in the radio frequency domain. The need for high electrical direct current conductivity may not be paramount. In this case, the exposed and patterned sample is baked to produce a nonetchable crystalline phase referred to as the high temperature crystalline phase in the patterned plumbing. In this case, the material in the exposed regions (that is, in the high temperature crystalline phase) has a lower loss tangent having lower RF losses, in comparison to the surrounding unexposed glass. The processed ceramic portion of the patterned plumbing becomes operational processed material within the volume. Regardless of the bake protocol used, the resulting volume consists of a glass ceramic package that can be cut into a desired shape for ease of handling. Embedded into this volume is a 3D patterned structure or arrays of interconnected structures. These embedded devices can have patterned electrical feed through that end at the surface as an interface to allow for surface connections. The surface can have mounting features for packaging the volume; for example, a ball grid array mounting scheme.

The created material in the plumbing can have various chemical, mechanical, electronic, magnetic, optical, and acoustical characteristics. A variety of examples can be shown, but for convenience, a chemical device, a mechanical device, an electronic device, a magnetic device that may be an electromagnetic device, an optical device, and an acoustical device are described.

Figure 2:
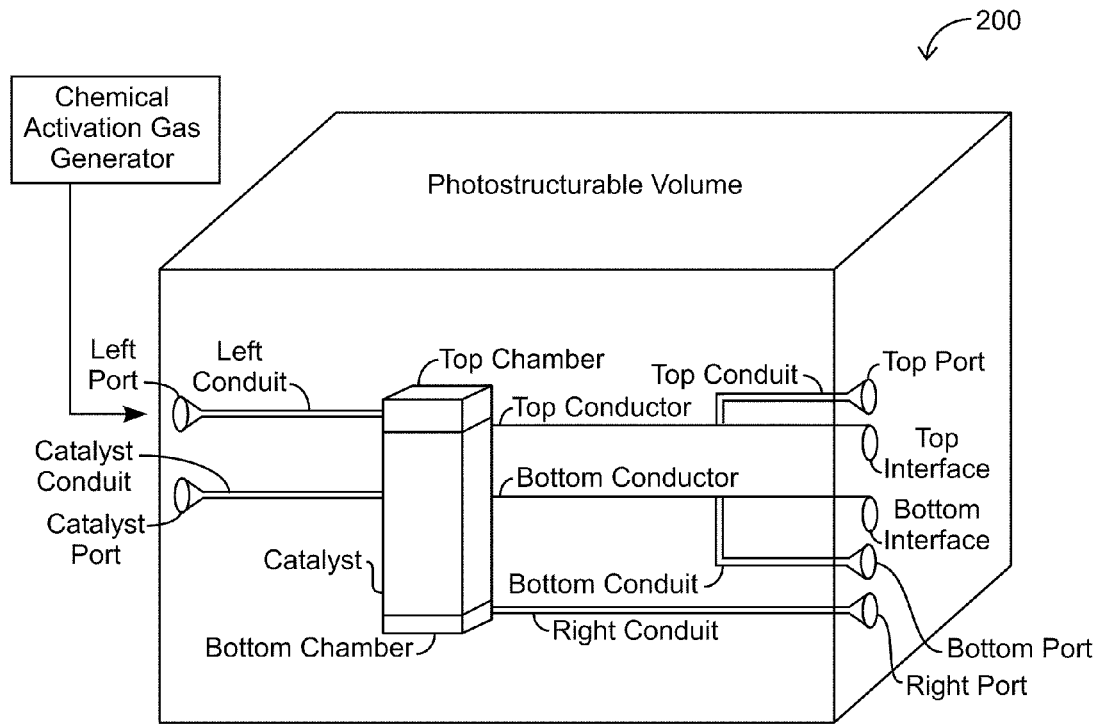
FIG. 2 is a schematic diagram of a chemical device disposed in a photostructurable ceramic volume, in accordance with an example embodiment of the invention.

Referring to FIG. 2, a chemical device 200 can be made from disposing a catalyst within the volume. A top chamber is connected through a top conduit to a surface top port. A bottom chamber is connected through a bottom conduit to a surface bottom port. The top and bottom conduits are fluidic conduits for creating a chemical reaction in the catalyst. A positive conductor to the catalyst is made by inserting a conducting material through a positive port and a positive conduit. A negative conductor to the catalyst is made by inserting a conducting material through a negative port and a negative conduit. The positive top and negative bottom conductors respectively have a positive top interface and a negative bottom interface. Fluids and gases may enter and exit the top and bottom chambers through the top and bottom ports and conduits leading to the catalyst that may be controlled by an electrical signal between the top and the bottom conductors. The positive and negative interfaces may be disc-shaped cavities filled with gold for electrical bonding.

An embedded chemical device comprises a photostructurable ceramic volume encapsulating plumbing. The ceramic volume includes an interface on a surface of the ceramic volume. The ceramic volume includes one or more ports and port conduits. The ceramic volume is a homogeneous volume of unexposed photostructurable ceramic material encapsulating the device material. The ceramic volume is a contiguous volume comprising the surface interface for communicating a chemical. The device material is disposed in the plumbing. The embedded device material forms a chemical device. Typically, a port conduit is plugged at least in part by the device material. In operation, a chemical is communicated along a path in the plumbing within the embedded chemical device. A chemical is communicated along a path in the plumbing to interact with the embedded chemical device. A chemical may be supplied by an external chemical source, such as a gas source, or may be generated by the device material. The chemical device may comprise one or more of sensors, detectors, separators, activators, neutralizers, and/or filters, with the chemical device interacting with the chemical. The interaction may be one of reaction, radiation, alteration, reception, explosion, neutralization, activation, transmission, and/or absorption of the chemical.

After the fabrication of the encapsulating plumbing around a cavity within the photostructurable ceramic volume, a chemical in the form of a paste, liquid, or gas can be admitted into the cavity. A form of optically excited chemical sensor can be manufactured when the chemical is light sensitive and changes transmission. The change in transmission can be measured and the device monitored by a light beam passing through the photostructurable glass ceramic volume. By arraying the cavity volumes, different chemicals can be placed in each volume where each has sensitivity to different wavelengths. Detectors are placed behind each embedded volume containing the selected chemical. At the correct wavelength, such as UVA or UVB for biological needs, when present, the illumination changes the transmission properties of the chemical. The optical transmission change may be measured by an external detector.

Another form of chemical sensor can be manufactured where the chemical placed in the embedded volume is sensitive (that is, the device changes properties) to external chemicals in the form of gas or liquids that come in contact with the embedded chemical. The external chemicals come into contact with the embedded chemical through the encapsulating plumbing channels and conduits that were used to make the embedded volume. An array of chemical sensors can be made by making many embedded cavities each connected through conduits to external ports with cavities filled with different chemicals, such as a series of different polymers that have different sensitivity to different toxic chemicals.

As another example, a liquid containing a series of chemicals is brought in the vicinity of an arrayed device. The liquid enters each conduit and when the right chemical, such as cancer causing Toluene, is present, the entering chemical will alter the property of the embedded chemical. This change in property can be measured by measuring, for example, the electrical resistance through the chemical, the heat generated through a reaction, the change in optical properties or a volume change, which could be measured by electrical capacitance. The arrayed device can become a complex sensor capable of detecting a variety of chemicals.

A form of chemical reactor can be manufactured where the embedded volume cavity in the photostructurable ceramic volume is filled with an explosive chemical that is exploded when activated by light coming through the ceramic volume, by vibration of the ceramic volume, or by exciting chemicals coming into contact with the explosive chemical. The excitable chemicals can be admitted into the embedded cavity through the ports and conduits. The microexplosion can be detected by optical emission, by acoustic emission detected by a microphone, by the release of gas or chemicals, or by inducing a torque force on an embedded microstructure, such as a plate or cantilever, that is embedded within the cavity that moves as a result of the microexplosion.

A form of chemical reactor can be manufactured where the embedded volume is serviced by two or more sets of conduits through which different chemicals flow and react in the embedded cavity volume. The reacted chemicals then flow into another exit conduit for additional analysis, storage, or chemical processing.

A chemical trap can be manufactured where the embedded volume is partially filled with a chemical that reacts with a desired chemical. The reaction product is trapped in the volume, and the remaining filtered chemical flows into an exit conduit for additional analysis. For example, a complex, miniature, and fully integrated chemical chromatography instrument can be manufactured.

A chemical filter can be manufactured where the embedded volume is connected with an input and output conduit. The center of the embedded volume that separates the input and output conduits may be a thin 50 micron wall structure that is patterned with microholes or structures that remove particles in the input liquid by physically trapping it at a filter wall. The wall may have patterned microstructures that are too small for liquid to pass as a result of surface tension forces but enable the evaporated gas to pass through and thereby make a liquid to gas separator or filter.

A biological material filter can be manufactured similar in design to the chemical filter except that the embedded walls have patterns that are designed to cut or induce lysis to cellular matter releasing the genetic material within, which flows through an output conduit and traps the gutted cellular matter.

A form of biological and chemical device can be manufactured that uses a DC or AC electric field. Three stacked and embedded volumes are manufactured each with input and output conduits. The center embedded volume is used to transfer chemicals, gases, and liquids. The outer two embedded volumes are filled with a conducting paste or low temperature, such as less than 450° C., melting metal. The paste and the metal are allowed to harden and cool. Electrical contacts are attached to the conducting volumes, and a high voltage is applied between the two conducting volumes to establish an electric field that will permeate the center conducting volume. As the center conducting volume is filled with a material, such as a liquid, solid, or gas, it will be under the influence of the electric field. The electric field could be used to separate ions in a liquid form in the center volume or move the liquid by electrophoresis and electrokinetic phenomena, to induce a polarization in a solid, such as poling nonlinear optical materials or ionizing gases.

Figure 3:
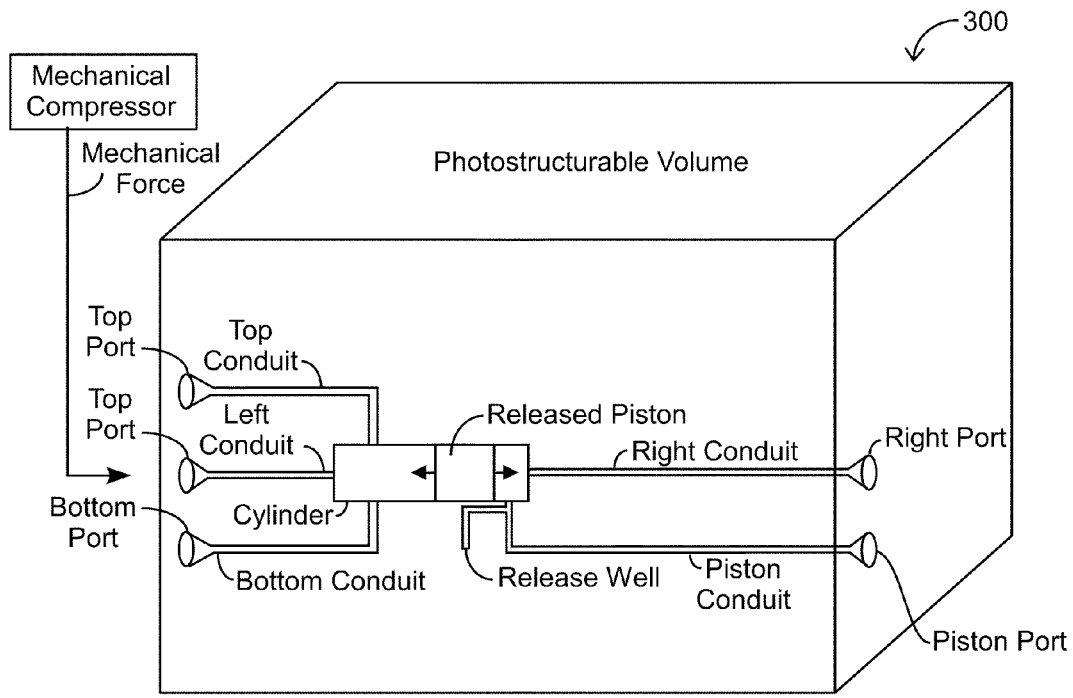
FIG. 3 is a schematic diagram of a mechanical device disposed in a photostructurable ceramic volume, in accordance with an example embodiment of the invention.

Referring to FIG. 3, a mechanical device 300 can be made from a disposed piston within the volume. In a first set of illustrative process steps, a right port, right conduit, piston port, piston conduit, and piston may be plumbed, and device material is inserted in the piston cavity through the piston conduit. In a second set of illustrative process steps, a cylinder, left conduit, top conduit, bottom conduit, left port, right port, and bottom port may be plumbed and evacuated. The top and bottom ports may be plugged with an inserted material. The piston can then move left to right due to gas or fluid pressure between the left port and right port. A mechanical device is characterized as having a moving part. A release well is a cavity that is used to collect debris for ablating material in the release conduit so as to free the piston for motion within the cylinder.

The device material may form at least part of a mechanical device. The mechanical device can comprise one or more of springs, diaphragms, latches, gears, motors, resonators, and/or dampers. The mechanical device interacts with a mechanical force. The interaction may comprise one or more of translation, rotation, flexion, reception, transmission, and/or absorption of mechanical force. A mechanical force is communicated along a path in the plumbing within the embedded mechanical device. The mechanical force may be supplied by an external mechanical force source, such as a mechanical compressor for providing gas pressure for moving the piston.

An embedded mechanical device comprises a photostructurable ceramic volume encapsulating plumbing and a device material disposed in the plumbing. The device material may be a mechanical material for forming a mechanical device encapsulated by the ceramic volume and disposed in the plumbing. The photostructurable ceramic volume encapsulating plumbing, the ceramic volume comprising an interface on a surface of the ceramic volume, and the device material disposed in the plumbing can be used for forming a mechanical device having the device material. The ceramic volume is a contiguous volume comprising a surface interface for coupling a mechanical force with the device material.

The mechanical device may be a fluidic or gas piston or a valve that can be manufactured by first patterning an embedded volume cavity with a photostructurable ceramic that is connected to input and output conduits or channels. In addition, other input and output channels are fabricated that connect to the embedded cavity but are orthogonal to the first input and output conduits. Within the embedded cavity, a block of ceramic in the shape of the cavity but slightly smaller is left during the chemical etching phase. The result is a free moving block of matter trapped within the cavity. By forcing a liquid, paste, gas through one of the input channels, the block is forced to move, by force pressure, to the opposite side allowing for liquid to pass through the input conduit and its orthogonal input line. When a liquid, gas, paste is then forced into one of the output lines, the block moves toward the initial input port turning off the flow between the inputs and allowing for flow between the two orthogonal output lines.

This valve can be modified with the replacement of the embedded sliding ceramic block with an embedded ceramic water wheel on a shaft. When liquid is forced through one of the input lines, the water wheel rotates on the shaft, and the liquid is forced through one of the output ports. A beam of light, such as from a laser LED, passes through the photostructurable ceramic to scatter off the moving water wheel. The scattered light is modulated by the spinning wheel rate, and therefore the liquid flow can be measured. A similar device can be manufactured by removing the water wheel and replacing it with a spinning microgear.

An ultrasonic mechanical transducer can be manufactured by first fabricating an embedded cavity with input and output conduits. Cantilever-like structures are then fabricated within the cavity where the bases of the cantilevers are fixed rigidly to the cavity walls. The cantilevers have small flat sections at the tips. The dimensions of the cantilevers determine their resonance frequency and bandwidth. When sound strikes and travels through the photostructurable ceramic, the sound couples into the cantilever motions and vibrates the cantilevers. The vibration frequency is optically measured by scattering light off the beams and measuring the amplitude modulation of the scattered light.

Another example of an embedded mechanical device is a magnetic actuator. A photostructurable glass ceramic material is first exposed by direct-write laser patterning in the pattern of an actuator, such as a flat piston head that is connected to a meander spring. The actuator pattern has input and output conduits. Hydrofluoric acid (HF) chemicals may be used to etch the ceramic into the shape of the piston head and meandering spring pattern. Metal with magnetic properties, such as nickel or other metal alloys, is then injected into the cavities, the metal is made to harden to form the actuator that is surrounded by the ceramic. A second laser direct-write laser patterning step then exposes the regions around the actuator that must be released. This region is then removed using the HF acid in concentrations that will etch the processed ceramic at about 18 microns/min at a faster rate than the nickel at about 1 micron/min. At the end of this process sequence, there exists within an embedded cavity volume, an actuator, such as a piston on a spring, that is free standing within the volume cavity. An external magnet lying on top of the photostructurable ceramic block is then used to move the embedded piston actuator via magnetic coupling.

In the exemplar magnetomechanical nickel actuator, and during the nickel metal injection process, a nickel and titanium alloy may be injected or a copper-zinc-aluminum-nickel alloy may be injected and hardened to a shape. After the metal injection, the next step is the process of removing the excess ceramic around the metal parts. Then a mechanical actuator can be manufactured that uses the shape memory alloy principle to impart force by running a current through the actuator. Because the metal segments are connected to the external world via input and output conduits, the attachment of electrical connections becomes practical.

Another magnetic device that can be affected by an external magnetic source is the following. A photostructurable glass ceramic material is first exposed by direct-write laser patterning in the pattern that is appropriate for the desired affect. The pattern which is connected by input and output conduits is vacated by HF chemicals to yield a network of interconnected cavities. The cavities are filled with magnetic ferrofluid. The input and output ports are sealed. When an external magnetic field, either permanent or via electromagnetic is applied the ferrrofluid viscosity changes radically temporarily mechanically stiffening the whole of the structure and providing a patterned magnetic field in the volume. When the external field is removed, the mechanical stiffness of the structure is relaxed.

Figure 4:
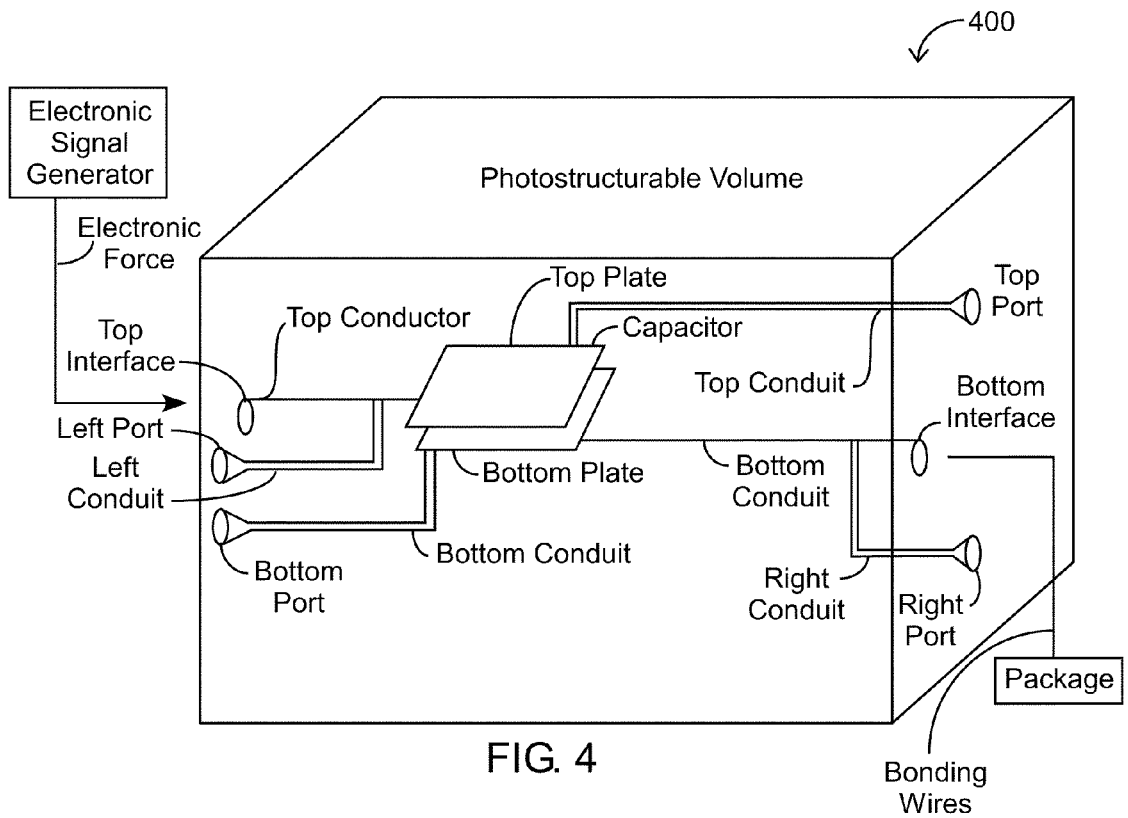
FIG. 4 is a schematic diagram of an electronic device disposed in a photostructurable ceramic volume, in accordance with an example embodiment of the invention.

Referring to FIG. 4, an electronic device 400 can be made by inserting a conducting material. For example, a simple capacitor can be made, whereby the plumbing includes a top plate having a top conductor and a top interface, a bottom plate having a bottom conductor and a bottom interface, a left port and left conduit for inserting the top conductor, a right port and a right conduit for inserting the bottom conductor, a top port and top conduit for inserting the top plate, and a bottom port and bottom conduit for inserting the bottom plate. The top and bottom interfaces may be used to make electrical contact with the embedded capacitor.

The electronic device material may be disposed in the plumbing. The electronic device material forms an electronic device. An embedded electronic device may comprise the photostructurable ceramic volume encapsulating plumbing, and the electronic device material disposed in the plumbing. The device material is an electronic material for forming an electronic device encapsulated by the ceramic volume and disposed in the plumbing. The ceramic volume is a contiguous volume having a surface interface for coupling an electronic signal with the device material. The electronic signal is communicated along a conduction path in the plumbing. The electronic signal may be supplied by an external signal source such as an electrical signal generator. The embedded electronic device may comprise one or more of sensors, cancellators, absorbers, isolators, converters, and/or conductors. The embedded electronic device has interaction properties that may comprise one or more of communication, reception, transmission, amplification, filtration, and/or dissipation.

The electronic device can be discrete components such as resistors, inductors, and transformers for DC and RF applications. An embedded channel within a photostructurable ceramic is patterned and the material in the channel removed. The channel has input and output conduits and ports. For a DC/AC current resistor, low temperature, such as less than 450° C. melting metal, which may be aluminum or metal paste, is pressure forced through the channel until the material exits at the output port. The resistance value is set by the natural conductivity of the paste after curing and by the channel dimensions. When the channel pattern is in the form of a coiled spring, then an inductor can be so fashioned. When a coiled spring of radius R1 is patterned within a coiled spring of radius R2, where R1 is less than R2, then an embedded transformer can be so fashioned.

To make a dielectric material capacitor, two conducting stacked channels are separated by a ceramic layer. Two embedded volume cavities are fashioned with an input port and an output port. The two volume cavities are separated by a predetermined distance. Both cavities are filled with metal via paste or low temperature melting metal. The cured paste or cooled metal makes a path that will conduct electricity. The stacked device is a capacitor. A power source is connected to one of the input ports of one cavity to the input port of the other stacked cavity. Three stacked and embedded cavities can be manufactured with each cavity having an input port and an output port, with the middle cavity separated from the cavity next to it through a very thin wall, for example, less than 20 microns. The middle cavity input and output ports are first temporarily sealed. The top and bottom cavities are filled with metal to form a conductor or conducting volumes. The middle cavity ports are opened and an acid wash is run to etch away the thin walls. The middle cavity is then filled with a dielectric material to achieve higher capacitance. The manufacturing technique is conducted in steps that can be used to make a storage battery where the top cavity is filled with a positive electrode material, the bottom cavity is filled with a negative electrode material, and the middle cavity is filled with an electrolyte.

For RF and microwave applications, such as at 10 GHz as required by waveguides, the channels are not filled with metal paste, but the channel walls may be coated by metal via chemical vapor deposition techniques. A metal organic gas is allowed to enter all of the vacant and patterned channels. The chemical vapor deposition temperature and the gas chemistry are used to deposit and coat the walls of the channels with the appropriate metal to make a RF waveguide. Metal microstructures can be fabricated within the waveguides for efficient launching of the RF energy into the waveguide. Similarly, the channel dimensions and shapes allow for various waveguide configurations and modes of operation. To make a dielectric resonator oscillator, a nearby but not connected volume cavity that is metal coated can be filled with dielectric material. The combination of a resonator, microstructure, and waveguide becomes a tuned circuit.

At some frequencies and with specific channel dimensions, the channels can be filled with a ferromagnetic material that allows the propagation of RF waves with the ability for low forward insertion loss and high reverse attenuation loss. With ferrite materials, it is practical to make phase shifters. One phase shifter design may use a rectangular embedded channel that has the walls covered by metal with a ferrite material toroid in the middle of the rectangular waveguide. To manufacture this device, three rectangular channel waveguides are made that are initially separated by a thin ceramic wall, such as less than 100 microns. The center waveguide is in the shape of a rectangular toroid with structural supports. A ferrite material is injected in the middle waveguide leaving the center waveguide free. The device is then placed into a small chemical etch bath to etch down the thin walls. The device is then placed into a chemical vapor deposition chemical reactor to metal coat the two rectangular side chambers. The final device is a nonreciprocal latching phase shifter using a ferrite toroid.

RF antennas can also be fashioned by patterning the shape of embedded antenna in the form of embedded channels with an input conduit and an output conduit. The fabricated device, with embedded channels and cavities in the form of an antenna, is then exposed a second time to UV light. The whole device is then processed in a bake step to form a preponderance of lithium disilicate crystals. The converted material, still with empty channels, is then filled with metal paste or low temperature melting metal, such as less than 450° C., and cured. The conversion of the ceramic to grow lithium disilicate crystals reduces the RF absorption properties of the ceramic for producing embedded RF antennas.

Figure 5:
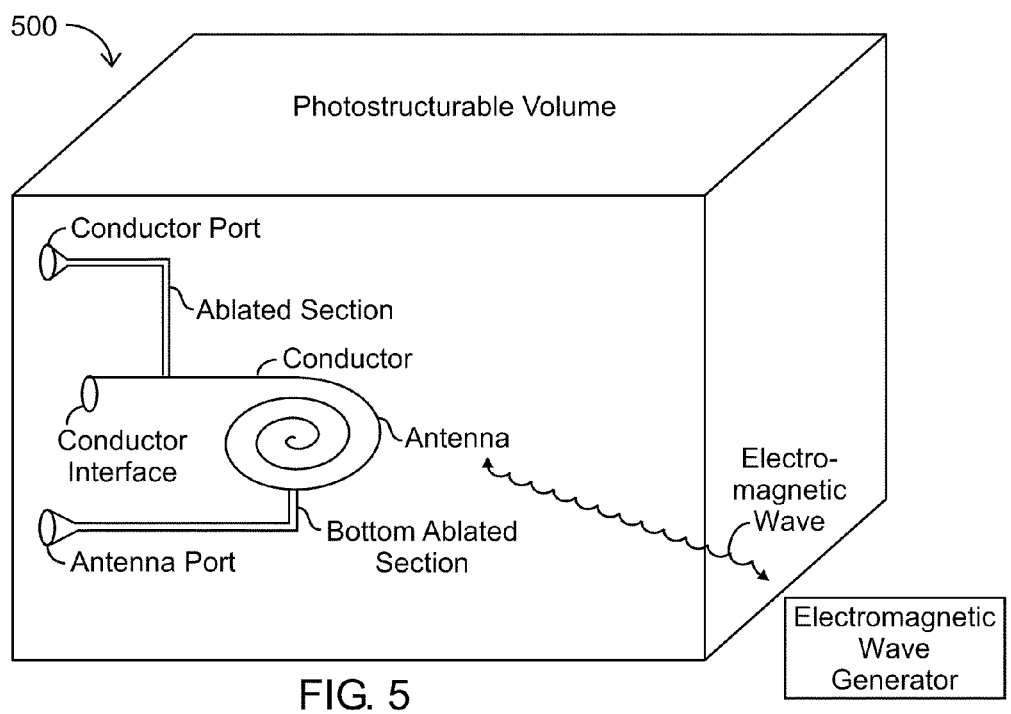
FIG. 5 is a schematic diagram of an electromagnetic device disposed in a photostructurable ceramic volume, in accordance with an example embodiment of the invention.

Referring to FIG. 5, a magnetic or electromagnetic device 500 can be made by inserting or creating a conducting embedded material. The material can be created by insertion or by optional processing of the ceramic material in situ. The electromagnetic device can be an antenna for communicating an RF or microwave signal. For insertion, the plumbing includes a conductor, a conductor port, and a conductor interface. After a conducting material is inserted into the conductor conduit, the conductor conduit can be laser treated to ablate a top ablated section of the conducting material in the conductor conduit so as to electrically disconnect the port from the conductor for improved isolation. Likewise, an antenna port, antenna conduit, and the antenna can be made by conducting material insertion through the antenna port, antenna conduit, and antenna that may be in the shape of a coil. The conducting material in the antenna conduit can be ablated to isolate the antenna from the port. In the case of an antenna, only one interface may be required. The distinction between electronic, magnetic, and electromagnetic is not determinative because as the electromagnetic device can be characterized by communicating in whole or in part an RF or microwave signal having both electric and magnetic waves.

The magnetic device material forms an electromagnetic device. An embedded magnetic device may comprise a photostructurable ceramic volume encapsulating plumbing. The ceramic volume may comprise an interface on a surface of the ceramic volume. The ceramic volume may further comprise a port and a port conduit. The magnetic or electromagnetic device may be one or more of antennas, modulators, mixers, coils, splitters, combiners, cancellators, absorbers, isolators, and/or converters. The electromagnetic device may interact with an electromagnetic wave. The interaction may be one or more of communication, reception, transmission, attenuation, filtration, separation, combination, and/or absorption of the electromagnetic wave. The electromagnetic wave may be communicated along a path in the plumbing within the embedded electronic device. The electromagnetic wave may be supplied by an external source such as a remote antenna.

In RF applications, the characteristic material property measurement is the loss tangent that represents the imaginary and real values of the material dielectric, and the relative permittivity. The measured loss tangent and permittivity values at 8 to 12 GHz are about $5\times10^{-3}$ and $5.6\times10^{-3}$, respectively, for one commercially available photostructural ceramic. The loss tangent, which can be related to the signal attenuation factor, is roughly half that of an unexposed area. Consequently, the RF signals can penetrate into the ceramic volume and are coupled into an embedded operational material, which is constituted by the crystalline material, which has a lower RF loss. The measured RF property values represent one state of the processed ceramic. There are other ceramic states of this material, and there are other material formulations that will yield other ceramic states. Consequently, it is possible to "engineer" a material formulation that will yield more RF compatible ceramics. The measured values for photostructurable ceramics can be compared with other common electronic materials. The high temperature crystalline state of some ceramics is found to have less RF loss than $8\times10^{-3}$ and nearly 10 times the loss when compared to alumina. A horn antenna can be fabricated that has features that enhance the antenna properties that cannot be easily fabricated with alumina or other conventional materials. It is known from antenna simulations that a horn antenna benefits from having an E-plane and H-plane baffle. These baffles increase the antenna aperture efficiency by a factor 4 and the gain by 6 db. These baffles can be 3D structures that reside within the chamber of the horn. A 3D corkscrew antenna structure can also be patterned into the volume. The antenna structure can be approximately 10 mm in diameter across, 2.3 mm deep, and embedded within a 1-cm-square, 3-mm-thick ceramic volume, with the corkscrew path being only 350 microns wide and 100 microns thick. When the application requires higher conducting paths with lower electrical resistance, then the exposed patterned structure is baked which results in the growth of etchable crystalline phase.

A magnetic device that may include an embedded circular-shaped channel may be fashioned in the form of a 3D coil by laser direct-write exposure patterning. The ceramic is then processed for removal by chemical etching the material within the exposure volume. Using the input and output conduits, the low temperature melting metal or metal paste is injected into the cavity. The injected material is cured by cooling molten metal or by baking metal paste. The resulting pattern is a conductor in the form of a coil. When a current is passed through the coil, it will act as an electromagnetic device setting up a magnetic field that runs the axis of the coil. A permanent magnet near the electromagnet will feel the force.

The magnetic device may be a magnet. An embedded cavity may be patterned into the photostructurable volume using laser direct-write patterning. The cavity may be connected with small input and output conduits. The material may be processed to remove the ceramic in the patterned areas resulting in a large embedded cavity that is connected by smaller input and output channels. A magnetic material is injected into the embedded cavity and cured in the presence of magnetic fields. An acid etch is used to remove the magnetic material within the input and output conduits, but not in the center embedded volume. The result is a ceramic material that is functionalized by an embedded magnet. Because the magnet is patterned within the ceramic, the magnetic force emanating from the ceramic will also have a distinct pattern.

Figure 6:
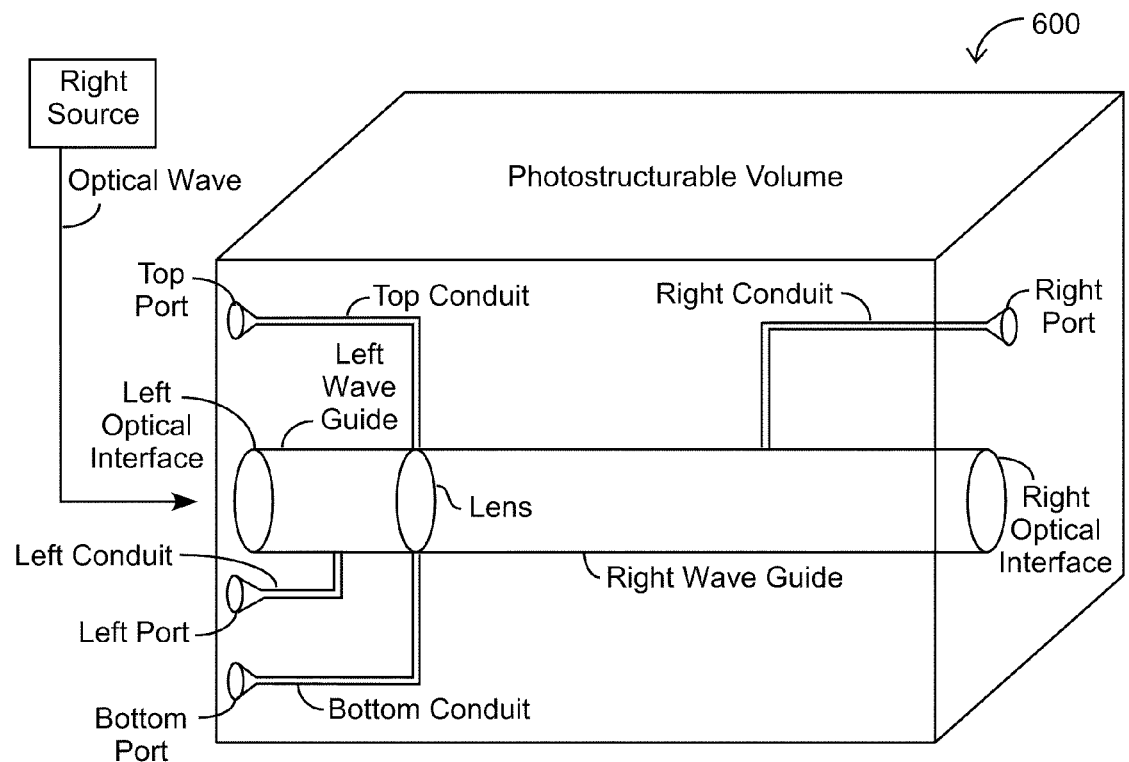
FIG. 6 is a schematic diagram of an optical device disposed in a photostructurable ceramic volume, in accordance with an example embodiment of the invention.

Referring to FIG. 6, an embedded optical device 600 may be made by inserting an optical material, such as molten glass, in optically compatible polymer or liquid. In a first set of illustrative process steps, a lens cavity may be formed along with a top and bottom conduit for inserting a lens optical material in the lens cavity. In a second set of illustrative process steps, left and right waveguide cavities are created and also inserted with an optic material respectively through left and right ports and conduits. Thus, three in-line cavities are formed. The ends of the left waveguide and right waveguide form optical interfaces through which photons are communicated. A light source provides an optical wave that can be communicated along and through the left and right waveguides and the lens as an embedded optical device. An optical wave may be communicated along a path in the plumbing within the embedded electronic device. The optical wave may be supplied by an external source, such as the light source.

The embedded optical device comprises a photostructurable ceramic volume cavity or an encapsulating plumbing; the embedded ceramic volume or plumbing serves as a connection interface to the surface. The ceramic volume may further comprise a port and a port conduit. The ceramic volume may further be comprised of shaped surface interfaces. In addition, the photostructurable ceramic may be used to write waveguides by pulsed laser compaction. A femtosecond pulsed laser may be used to compact the glass to raise the value of the local index of refraction above its surrounding area and thereby guide light within the higher index material. Consequently, a complex optical device may be assembled, which includes fabricated plumbing and compacted, higher index, glass.

The end of a laser compacted optical waveguide can include an embedded cavity that is fashioned with the cavity remaining a void and filled with anything, such as air. Positive or negative curvature lens can be formed and used to focus or diverge the light emanating from the waveguide. A mirror to bend the light at an abrupt angle may be made using evaporated metal. To make a lens, the embedded cavity wall is shaped with a positive or negative curvature, with the shaped wall being geometrically placed in front of the optical waveguide end point. To make a mirror, the embedded cavity walls must be flat and at an angle to the waveguide to induce total internal reflection. The photostructurable ceramic volume with encapsulating plumbing is first fabricated to have curved walls. The material may be exposed by a laser direct-write process, baked, and chemically etched. The baked material then undergoes another low temperature anneal, such as between 425°-450° C. for 10 hours, after chemical etching to smooth the walls. The resulting device may then be placed in a femtosecond laser direct-write patterning tool to manufacture the optical waveguides.

When the manufactured cavity with encapsulated plumbing is filled with optically active material then the device may alter the properties of the guided light in the photostructurable ceramic by optical filtering or harmonic generation. For example, if the active material is optically active, and when the guided light is intense like a laser, it is possible to induce harmonic generation, frequency up conversion, Raman excitation frequency shifting, amplitude modulation, phase modulation, optical gain, and fluorescence. The different possibilities are the result of what optical material is placed in the embedded cavity. For example, when the embedded cavity is filled with many of the aliphatic, aromatic, or mercaptan chemical compounds, such as benzene and derivatives, stimulated Raman and optical frequency shifting can be made. When the embedded cavity is filled with dyes, such as laser dyes, then optical fluorescence can be realized. However, when the dye is also optically excited, then optical gain can also be realized.

An electrooptic device may be manufactured when a three-stack embedded cavity structure is manufactured in a photostructurable ceramic, each stack having encapsulated plumbing with input and output conduits. The top and bottom cavities may be filled with metal either through a paste or low temperature molten metal while the center cavity is temporarily sealed until the metal is cured. The seal may be removed, and an optical medium is placed within the center cavity. A voltage may be applied to the top and bottom cavities. Depending on the optical material inserted into the center cavity, the optical polarization of an incident light, such as through the Kerr effect, can be controlled. Consequently, the device can modulate the light and provide light shuttering. When the optical medium is a liquid crystal, the optical transmission properties can be also changed.

The embedded optical device can be a periodically poled nonlinear optical device. In the stacked three-cavity device, a slurry of birefringent nanoparticles is first injected into the center cavity before metallization. Then, the other two cavities may be filled with metal and cured. A high voltage is applied, and the device is placed in an oven for 5-10 hours. The resulting device may be an encapsulated nonlinear optical device that has been poled and quasiphase matched to the input wavelength. The periodically poled nonlinear optical device may have 20 times the efficiencies of frequency up conversion than nonperiodically poled nonlinear optical device materials.

Glass and ceramics are optically good materials in the visible and the near infrared. Below two or three microns, silica-based glasses and ceramics absorb optical radiation. The embedded device can extend the optical operational range of these materials to farther in the IR or in UV. An array of embedded channels may be processed in photostructurable ceramic. The embedded cavities may have encapsulated plumbing with input and output ports. In this device, the input and output conduits and the embedded cavity all have the same dimensions. The cavities allow for input radiation to pass through to a pixilated detector in the back. In each embedded channel, a material is injected that has transmission properties at wavelengths that are beyond that of the encapsulating glass. For example, a hole may be used for very UV (e.g., short wavelength) radiation, a scintillating material may be used for Gamma radiation, bare glass may be used for visible and IR radiation, and chalcogenide-based nanoparticles may be used for mid IR radiation.

The optical device may be one or more of lens, mirrors, reflectors, splitters, combiners, modulators, filters, polarizers, absorbers, emitters, detectors, converters, prisms, separators, gratings, and/or fibers. The optical device interacts with an optical wave. The interaction may be one or more of communication, reception, transmission, reflection, separation, conversion, concentration, and/or absorption of the optical wave.

Figure 7:
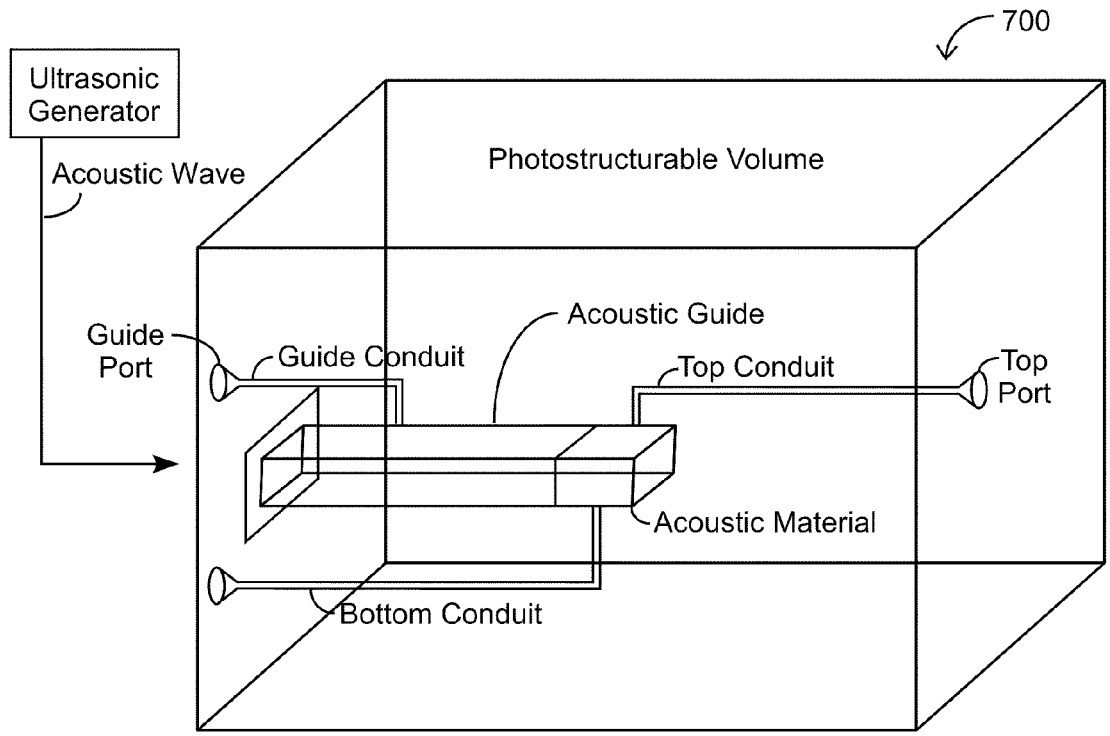
FIG. 7 is a schematic diagram of an acoustic device disposed in a photostructurable ceramic volume, in accordance with an example embodiment of the invention.

Referring to FIG. 7, an acoustic device 700 may be made by inserting an acoustic material through top and bottom ports and conduits in a first illustrative set of process steps. In a second set of illustrative process steps, an acoustic guide device may be formed using an acoustic interface, an acoustic guide, and a guide port. The acoustic interface couples to an acoustic wave from an acoustic wave source, such as an ultrasonic generator, travels through an acoustic guide device and is absorbed by the acoustic material functioning as an acoustic absorber. The embedded acoustic device may comprise a photostructurable ceramic volume with encapsulating plumbing with an acoustic interface on a surface of the ceramic volume. The acoustic wave is communicated along a path in the plumbing of the embedded acoustic device. The input acoustic wave may be supplied by an external source. The acoustic device may be one or more of a sensor, cancellator, absorber, isolator, converter, phase delay line, focusing structure and/or conduit. The acoustic device interacts with the acoustic wave. The interaction is one or more of a communication, reception, transmission, and absorption of the acoustic wave.

It is known that sound travels at different velocities in different materials. Photostructurable ceramic provides a speed of sound that varies by about 10% depending on whether the sound is traveling through the glass or a particular ceramic material. This difference in sound velocity could be further enhanced by inserting other materials in the prior fabricated plumbing. An acoustically driven device may be manufactured by fabricating a photostructurable ceramic volume with encapsulating plumbing that includes an input port and an output port. In addition, other ports are patterned to the center embedded cavity and chemically etched. These other ports are aligned in a geometric arrangement that will control the travelling sound waves. The two input and output ports are temporarily sealed, and material in the form of a paste or high viscosity liquid, for example, is forced through the additional ports. The conduit may be filled but the center embedded cavity may not be filled. The type of material chosen for filling the conduits are materials where sound travels at higher speed than the ceramic, such as a metal or material of a lower density (such as air gap or another lower density material, for example, a paste). These may be sound-driver conduits. An advantage of the invention is the ability to pattern in 3D the length of the sound-driver conduits to precision within a fraction of the acoustic wavelength. After the material is placed in the channel and cured then liquids and gases are brought through the initial input conduit, through the center embedded cavity and out through the output conduit. Sound as generated from a piezoelectric device or other acoustic device, such as a microphone, or natural ambient noise is generated/coupled at the input of the sound-driver conduits. The sound will also couple or enter other parts of the material that do not have the conduits. As the sound travels through the material and the sound-driver conduits, the precise length of the conduit defines the phasing of the sound energy in relation to the ambient sound traveling through the medium. It can be designed such that the sound waves meet in phase or out phase at the center of the cavity containing a fluid or gas. If they are in phase, the result is a severe coherent disturbance of the medium within the center cavity, to induce a local explosion, severe agitation, or chemical reaction. If they are exactly out of phase, then there is a local cancellation of sound energy leaving the area undisturbed. Furthermore, by setting the phasing properly along with numerous patterned sound-driver conduits, it is possible to induce motion or vorticity in the liquid or gas located in the center cavity. This vortice motion can be used to flip or rotate biological material, such as cells, that are flowing in the liquid.

Figure 8A:
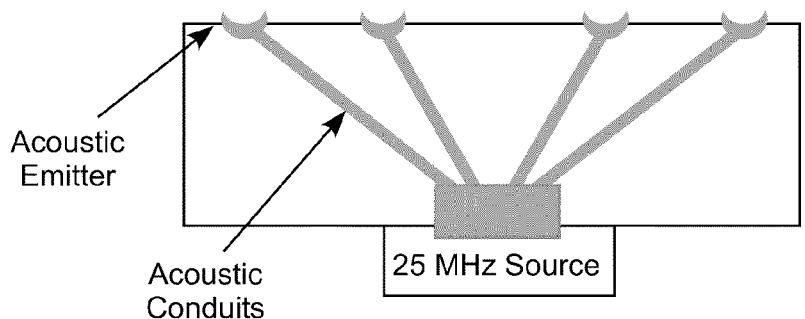
FIGS. 8A-8C are schematic diagrams of embodiments of acoustic devices disposed in a photostructurable ceramic volume, in accordance with an example embodiment of the invention.
Figure 8B:
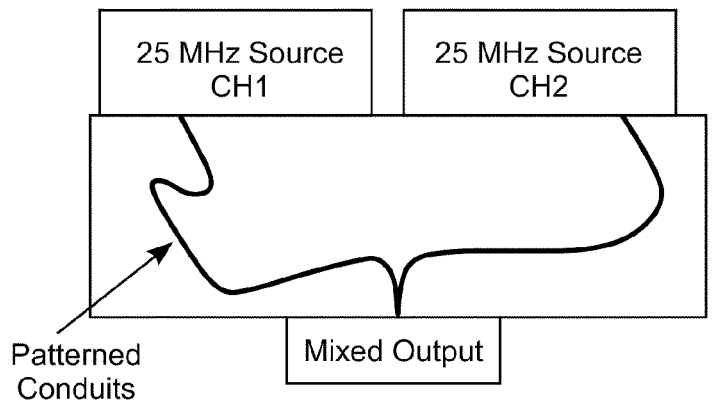

As an example, a number of devices can be developed if the acoustic velocity can controllably be set and the path (e.g., sound-driver conduits) patterned with high precision. Beyond just the ability to make lenses for concentrating acoustic energy, it is possible to make phased array emitters and analog mixers in glass. A phased array emitter, as illustrated in FIG. 8A, may comprise many sound-driver conduits such that there is a specific relationship in the wavelength phase among the emitters which enables the output to have directionality. That is, the conduits may have a fixed relative length delay lines. A second potential device is an analog mixer, as illustrated in FIG. 8B. A key element in any mixer is the delay line. If two sound sources impinge on a piece of processed glass that includes sound-driver conduits (e.g., delay lines) of specific lengths that may be sized to introduce an acoustic delay in one conduit relative to the other, then at a specific physical space where these two delay lines cross, the output sound will be mixed. For example, it is possible to mix two 25 MHz baseband frequency channels, in a 2-mm-thick structured glass ceramic wherein one conduit has a length different from the other so as to cause an acoustic delay in one relative to the other. With higher patterning precision, it is also possible to mix acoustic energy at GHz frequencies. With the right kind of transducer (e.g., electrical antenna+piezomaterial), it is possible to directly convert GHz electromagnetic radiation directly to acoustic frequencies.

Figure 8C:
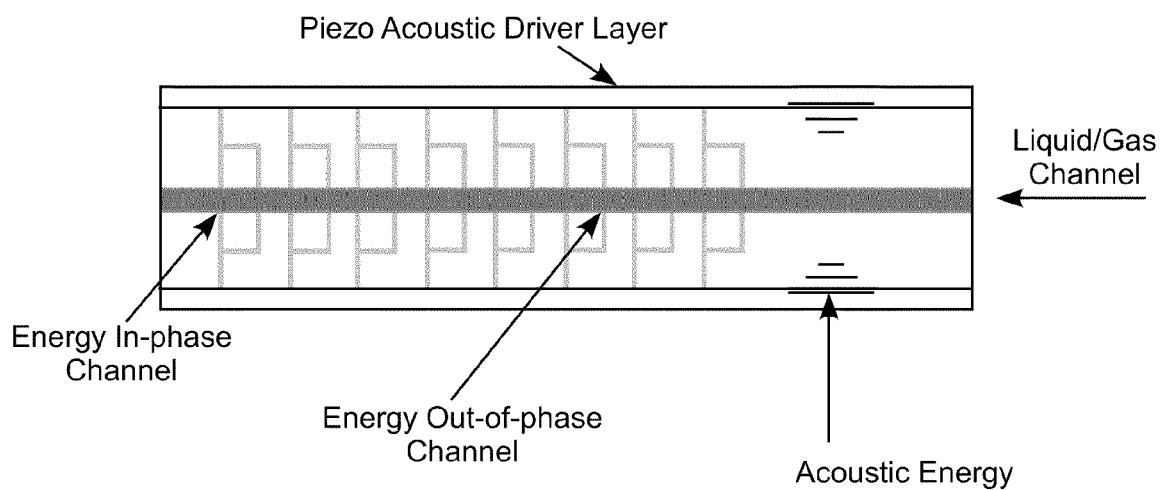

A third example is the development of a liquid or gas pump that may be primarily driven by acoustic energy, as illustrated in FIG. 8C. A small channel is first patterned and structured that will convey the gas or liquid. Around this channel and over a fixed length are fabricated sound-driver conduits that convey sound from the surface to the channel. Sound-driver conduits are patterned at repeated intervals in sequence and along the length of the channel such that there is an alternating in phase conduit and an out of phase conduit. The in phase conduits are points of high acoustic energy, where the sound is compounded, while the out of phase conduits are places where the sound is canceled. As the sound travels into the media, the in phase conduits will tend to push the material that is in the channel into the out of phase segments where there is relative calm.

Referring to all of the Figures, the encapsulated devices typically have interfaces and ports for external communications by way of chemicals, mechanical forces, electrical signals, electromagnetic signals, optical signals, and acoustic signals. A port is generally used for inserting materials, or for communicating device stimulus and reactions, including photons, acoustic waves, chemical gases and fluids, electrical signals, electromagnetic waves, and mechanical forces for interaction with the embedded devices. The ports are typically used for the injection of the device materials. The ports and conduits may retain a portion of the device material after processing. At times, it may be necessary to release a portion of the device from runners contained within the conduit for operational isolation between the device and the runners. For example, the piston can be released. A release well is a cavity formed in the volume to collect debris from ablating the runner in the conduit for releasing the piston. Also, thin conduction lines may be thin enough to induce ablation by focused laser light so as to provide electrical isolation of an embedded electrical device. In some designs, the ports can be used as an injection port during fabrication and as an interface during operation, such as for bonding wires in the case of electrical signals or coupling signals, waves, and chemicals to external sources. The bonding wires may be attached to a package. The volume exterior surface may be milled or molded to shape for conformal packaging. A patterning design can be used in combination with a pressure extrusion process for inserting materials into or out of the entry and exit ports that are on different faces of the encapsulating ceramic volume. With this extrusion approach, the flowing conducting medium can be forced in from one face, through the photostructurable volume, and out the other face.

A conducting paste epoxy can be used for inserting a conducting material in the photostructurable volume. These materials are manufactured with a variety of viscosities, conductivities, and cure hardening times. These materials are a suspension of metallic particles usually in an organic binder. These materials cure at temperatures of 100° C., but higher temperatures are possible just as long as it is below the glass transition of the photostructurable glass. For a particular commercial variety the glass transition is at 465° C. A force extrusion process is used to fill the embedded plumbing cavities with the conducting compound. A final step is to wipe all the surfaces with a cleaning solution to remove excess material and then bake the device in an oven to cure and globally anneal the inserted compound. The resulting part is a glass ceramic package encapsulating a metallic structure. To demonstrate the process, straight holes can be metalized with a silver paste for forming an embedded conducting segment connected to input and output electrical connection interface pads.

In addition to using high-pressure extrusion to force metal compounds into the plumbing cavities, a wick process can be used to wick molten metal into the cavities. Heat can be used to raise the structured ceramic sample temperature up to about 600° C., to maintain mostly amorphous glass, and not lose feature resolution. When a small amount of quartz, such as crystobalite, within the amorphous glass, can be tolerated in the application, then a second exposure and bake protocol of the structured sample (temperatures approaching 800° C.) are possible. Consequently, any metal or a fusible alloy, that is a eutectic alloy capable of being fused and liquefied by heat, such as solders, that melts at a lower temperature, may be wicked into the cavities, such as aluminum at 659° C., tin at 232° C., zinc at 419° C., and indium at 156° C.

The method can be used to imprint functional paths, such as conducting paths, in the structured component. This includes additional steps, but is more versatile and allows for different types of material properties to be enabled for more than just electrically conducting, but also magnetic and thermally conducting, as well as others. There is the development of photocurable polymers, photocurable suspensions, photocurable epoxies, and photocurable ceramics. All these materials include a photosensitizer that is used to initiate the curing or fixing process. The photofixing process can be either done through one or two photonic nonlinear mechanisms. In some cases, the photocuring process is a cross-linking of molecules. In other cases, the photo initiation entails a direct molecular transformation. Regardless of the mode of operation, photocuring materials can be used as part of an embedded device disposed in the volume.

It should now be apparent that it is possible to apply different materials having different physical properties, such as different magnetic, electronic, thermal, optical, and conducting properties, into selected plumbing cavities of a photoceramic volume. Because the materials cure after photoexcitation or photopolymerization, and because a laser direct-write patterning tool can be used to pattern the initial ceramic material, the process may comprise sets of sequences of steps, for depositing the respective materials. A first material may be a photoinduced electrically conductive material that is forced into the plumbing cavities. The surface is wiped for cleaning, and the laser-patterning tool is operated over the select regions. In these regions, the material is polymerized or cured and becomes harder and could even be chemically bonded to the ceramic cavity surfaces. If necessary, the volume is then placed into the force extrusion tool, and a solvent solution is run to clear out the other cavities not exposed but filled with unexposed material. A second material with a different physical property is placed into the extrusion tool and forced into remaining plumbing cavities. The volume is then placed under the laser direct-write pattern tool again and other embedded cavities or segments are polymerized. The process then repeats with a third or fourth set of photoinitiated materials. Upon completion, encapsulated within a ceramic volume are adjoining structures that have different physical properties.

Using wavelength-sensitized materials, an automated tool can be used that incorporates the forced extrusion of chemicals and photomaterials, with a flood exposure at selective wavelengths, thereby removing the need for direct-write patterning. It should also be apparent that many novel types of devices can be fabricated.

An advantage of this invention is the ability to integrate devices that control acoustic, electrical, mechanical, chemical, optical, and magnetic properties all on to a common platform, that is, a single glass ceramic volume. This enables the placement of multiple functionalities on to a common platform, such as to provide power or energy to an adjoining system. By a sequential patterning (i.e., exposure), and a series of steps that include filling and plugging, it is possible to build into a glass ceramic volume plumbing that will support the transfer and control of acoustic, electrical, mechanical, chemical, optical, and/or magnetic properties. For example, it is possible to build an optical plumbing that is encapsulated (top and bottom) by electrical plumbing. To fabricate this device, all the necessary plumbing for both electrical and optical may be patterned (e.g., direct-write laser exposure) in the glass ceramic material. The exposed material is baked and then chemically etched to remove the areas where new material is to be introduced. Selected conduits may be first plugged. The material with the highest processing temperature is introduced first into the open plumbing conduits; this introduction can be done via gas, liquid, or high pressure force until all the desired conduits have been filled with the new material. The sample is then processed (e.g., baked) to ensure that the material in the plumbing is set. If the new material is not a solid, then the conduits are physically plugged. Second, the plugs covering the empty conduits are removed, and the second material is introduced using the same approaches as described above. In the example being described, the metal in the form of paste, or chemical vapor deposition gas, or low melting temperature liquid (e.g. indium) is introduced in the electrical plumbing conduits. The entrance and exit of these conduits are sealed (e.g., plugged). Depending on the type of metal, a baking step may be necessary to increase the conductivity of the metal. The plumbing conduits for the optical material are then opened, and an optical material is then introduced (for example, a liquid that displays the optical Kerr effect). The entrance and exit of the optical plumbing conduits are plugged. The design is such that the optical axis of the device does not intersect the entrance and exit ports. The electrical plumbing conduit plugs are removed, and wire or other attachment to an external power source is connected (e.g., soldering). The integrated system, which is on a common glass ceramic platform, has an optical device and an electrical device which for this example will induce a change in the optical polarization of transmitted light as a function of the applied voltage.

The system could be more complex by fabricating with the device structures that focus or alter the properties of the light before it reaches the Kerr effect liquid. With the same fabrication approach as described above but with an open channel for liquid flow, acoustic sound-driver structures for pumping the liquid and nearby electrical or magnetic plumbing conduits may make a chemical reactor or filter. Using this sequential fabrication approach, one of ordinary skill in the art can manufacture complex systems that include acoustic, electrical, mechanical, chemical, optical, and magnetic properties all on a common platform. The materials that can be used to fill the plumbing could be in the form of pastes, liquids, gas, nanoparticles, or biological material. Because glass ceramics are known for their high stiffness properties, the viscosity of the material to be introduced could be quite high for a given applied force. Similarly, for a given viscosity and applied force, the high stiffness properties of the glass ceramics allow for smaller plumbing diameters to be fabricated which enables the miniaturization of complex systems.

Many modifications and other embodiments of the invention set forth herein will be apparent having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An embedded chemical reactor device, comprising:
   a photostructurable ceramic volume encapsulating plumbing comprising a port and conduit fluidically coupling a device material to an exterior surface of the photostructurable ceramic volume, wherein the ceramic volume is a homogenous volume of unexposed ceramic material and the plumbing is formed by an exposure of the photostructurable ceramic volume to a laser during a photostructurable process; and
   the device material disposed in the plumbing, the device material being an explosive chemical material;
   an excitation chemical disposed in the conduit and contacting the device material;
   wherein the ceramic volume is a contiguous volume and wherein the embedded device material is encapsulated by and explodes within the ceramic volume.

2. The embedded chemical device of claim 1, wherein the contact between the device material and the excitation chemical produces
   an explosive interaction.

3. The embedded chemical device of claim 2, wherein the excitation chemical is in a gaseous state.

4. The embedded chemical device of claim 2, wherein the excitation chemical is in a liquid state.

5. An embedded filter device, comprising:
   a photostructurable ceramic volume encapsulating plumbing, wherein the ceramic volume is a homogenous volume of unexposed ceramic material and the plumbing is formed by an exposure of the photostructurable ceramic volume to a laser during a photostructurable process;
   wherein the plumbing comprises a filter,
   an input conduit extending from an outer surface of the ceramic volume to the filter and providing a first fluidic path to the filter;
   an output conduit extending from the outer surface of the ceramic volume to the filter and providing a second fluidic path to the filter;
   device material disposed in the ceramic volume and forming the filter, the ceramic volume comprising a surface interface supplying a chemical to the filter via the input conduit;
   wherein the filter is disposed between the input conduit and the output conduit and wherein the filter comprises a wall structure comprising a plurality of microholes, each microhole providing a passageway through the wall structure, and wherein the filter wall structure further comprises a plurality of cutting patterns disposed along a surface of the filter wall, wherein the cutting patterns cut cellular matter of the chemical.

6. An embedded chemical device, comprising:
   a photostructurable ceramic volume encapsulating plumbing, wherein the ceramic volume is a homogenous volume of unexposed ceramic material and the plumbing is formed by an exposure of the photostructurable ceramic volume to a laser during a photostructurable process, the ceramic volume comprising:
a top chamber:
a bottom chamber;
a catalyst chamber disposed between the top chamber and the bottom chamber and in fluid communication with the top chamber and the bottom chamber;
a top chamber conduit providing a fluidic pathway between the top chamber and an exterior of the ceramic volume;
a bottom chamber conduit providing a fluidic pathway between the bottom chamber and the exterior of the ceramic volume;
an electrical conductor having a first end electrically coupled to the catalyst chamber and a second end disposed along the exterior of the ceramic volume;
device material comprising a catalyst disposed in the catalyst chamber, the device material forming a chemical device;
a first chemical disposed in the top chamber, the first chemical interacting with the catalyst;
a second chemical disposed in the bottom chamber, the second chemical interacting with the catalyst;
wherein the catalyst receives an electrical signal from the electrical conductor to control the catalyst.

7. The embedded chemical device of claim 6, wherein the ceramic volume comprises a homogeneous volume of unexposed photostructurable ceramic material encapsulating the device material.

8. The embedded chemical device of claim 6, wherein the plumbing has shapes including at least one of a cavity, via, tank, void, bubble, tube, conduit, gap, well, sphere, plenum, tunnel, plate, coil, feedthrough or guide.

9. The embedded chemical device of claim 6, wherein the second chemical is supplied by an external source via the bottom chamber conduit.

10. The embedded chemical device of claim 6, wherein the first chemical is supplied by an external source via the top chamber conduit.

11. The embedded chemical device of claim 6, further comprising a second electrical conductor having a first end electrically coupled to the catalyst chamber and a second end disposed along the exterior of the ceramic volume, wherein the electrical conductor is a positive electrical conductor and wherein the second electrical conductor is a negative electrical conductor.

* * * * *